United States Patent
Shimamoto

(10) Patent No.: US 12,215,210 B2
(45) Date of Patent: Feb. 4, 2025

(54) FLUORINE RESIN SURFACE MODIFICATION METHOD, SURFACE-MODIFIED FLUORINE RESIN PRODUCTION METHOD, JOINING METHOD, MATERIAL HAVING SURFACE-MODIFIED FLUORINE RESIN, AND JOINED BODY

(71) Applicant: Ushio Denki Kabushiki Kaisha, Tokyo (JP)

(72) Inventor: Akihiro Shimamoto, Tokyo (JP)

(73) Assignee: Ushio Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 18/006,961

(22) PCT Filed: Jul. 20, 2021

(86) PCT No.: PCT/JP2021/027171
§ 371 (c)(1),
(2) Date: Jan. 26, 2023

(87) PCT Pub. No.: WO2022/024882
PCT Pub. Date: Feb. 3, 2022

(65) Prior Publication Data
US 2023/0340220 A1    Oct. 26, 2023

(30) Foreign Application Priority Data
Jul. 27, 2020   (JP) .................................. 2020-126099

(51) Int. Cl.
C08J 5/12 (2006.01)
C08J 7/12 (2006.01)
H05K 1/03 (2006.01)

(52) U.S. Cl.
CPC ............... *C08J 7/123* (2013.01); *C08J 5/124* (2013.01); *H05K 1/034* (2013.01); *C08J 2327/18* (2013.01)

(58) Field of Classification Search
CPC ........ C08J 5/124; C08J 7/123; C08J 2327/18; H05K 1/034
See application file for complete search history.

(56) References Cited

U.S. PATENT DOCUMENTS

2017/0231088 A1* 8/2017 Akatuka .................. B32B 7/06

FOREIGN PATENT DOCUMENTS

| JP | 06279590 A | * 10/1994 | ............... C08J 3/28 |
| JP | H06-279590 A | 10/1994 | |

(Continued)

OTHER PUBLICATIONS

An Office Action; "Notice of Reasons for Refusal," mailed by the Japanese Patent Office on Oct. 6, 2023, which corresponds to Japanese Patent Application No. 2022-540223 and is related to U.S. Appl. No. 18/006,961; with English language translation.

(Continued)

*Primary Examiner* — Bijan Ahvazi
(74) *Attorney, Agent, or Firm* — Studebaker & Brackett PC

(57) ABSTRACT

Provided is a fluorine resin surface modification method wherein an object to be processed and a processing device and the like are not readily damaged, wherefrom the risk of harmfully impacting a human body is small, and which can be carried out with simple equipment. The fluorine resin surface modification method including the steps of: irradiating an organic compound containing an oxygen atom with ultraviolet light having at least an intensity in a wavelength range of 205 nm or less to generate a radical; and bringing (Continued)

the radical into contact with a surface of a fluorine resin to form a hydrophilized layer on the surface.

14 Claims, 9 Drawing Sheets

(56) References Cited

FOREIGN PATENT DOCUMENTS

| | | | | | |
|---|---|---|---|---|---|
| JP | H10-168199 | A | | 6/1998 | |
| JP | 2002146066 | A | * | 5/2002 | |
| JP | 2004307547 | A | * | 11/2004 | ............... C08J 7/12 |
| JP | 2008-075030 | A | | 4/2008 | |
| JP | 2010156022 | A | * | 7/2010 | ............... C08J 7/00 |
| JP | 2012-046781 | A | | 3/2012 | |
| JP | 2017-043829 | A | | 3/2017 | |

OTHER PUBLICATIONS

An Office Action mailed by the Japanese Patent Office on Jun. 27, 2023, which corresponds to Japanese Patent Application No. 2022-540223 and is related to U.S. Appl. No. 18/006,961.
International Preliminary Report on Patentability and Written Opinion issued in PCT/JP2021/027171; date of issuance: Jan. 31, 2023.
International Search Report issued in PCT/JP2021/027171; mailed Oct. 5, 2021.

* cited by examiner

FLUORINE RESIN SURFACE MODIFICATION METHOD, SURFACE-MODIFIED FLUORINE RESIN PRODUCTION METHOD, JOINING METHOD, MATERIAL HAVING SURFACE-MODIFIED FLUORINE RESIN, AND JOINED BODY

TECHNICAL FIELD

The present invention relates to a fluorine resin surface modification method, a surface-modified fluorine resin production method, a joining method, a material having a surface-modified fluorine resin, and a joined body.

BACKGROUND ART

Since a fluorine resin has characteristics of a low dielectric constant and a low dielectric loss tangent, the use of the fluorine resin as a circuit board material has recently attracted attention. Since the fluorine resin has characteristics of chemical resistance (chemical stability) and a low friction coefficient, in recent years, the use of the fluorine resin as a medical material has also attracted attention. However, since the surface free energy of the fluorine resin is significantly low (that is, the wettability is low), the fluorine resin has a disadvantage that it is less likely to be bonded or joined to other material. Therefore, conventionally, when the fluorine resin is bonded or joined to the other material, it may be required to perform surface modification such as impartation of a hydrophilic functional group to the surface of the fluorine resin.

Patent Document 1 describes a surface modification method in which the surface of a PTFE (polytetrafluoroethylene) substrate, which is one of fluorine resin substrates, is hydrophilized by plasma processing in the presence of helium gas. Patent Document 2 describes a surface modification method in which a PTFE film is irradiated with vacuum ultraviolet rays in the atmosphere of a highly reactive gas such as ammonia or hydrazine to form a functional group containing an active hydrogen atom on the irradiated surface of the film.

PRIOR ART DOCUMENTS

Patent Document

Patent Document 1: JP-A-2012-46781
Patent Document 2: JP-A-H10-168199

DISCLOSURE OF THE INVENTION

Problems to be Solved by the Invention

In the method described in Patent Document 1, an object to be processed may be electrically damaged by the plasma processing. The method described in Patent Document 2 has the risk that the reactive gas causes corrosion of a processing device and a pipe, and the risk that the leakage of the reactive gas from the processing device harmfully impacts a human body. A large-scale device is required to perform the methods described in Patent Document 1 and Patent Document 2.

In view of the above problem consciousness, an object of the present invention is to provide a fluorine resin surface modification method wherein an object to be processed and a processing device and the like are not readily damaged, wherefrom the risk of harmfully impacting a human body is small, and which can be carried out with simple equipment, a surface-modified fluorine resin production method, a joining method, a material having a surface-modified fluorine resin, and a joined body.

Means for Solving the Problems

As a result of intensive research, the present inventor have created a surface modification method wherein an object to be processed and a processing device and the like are not readily damaged, wherefrom the risk of harmfully impacting a human body is small, and which forms a hydrophilized layer on a fluorine resin. As will be described in detail later, the surface modification method includes the steps of: irradiating an organic compound containing an oxygen atom with ultraviolet light having at least an intensity in a wavelength range of 205 nm or less to generate a radical; and bringing the radical into contact with a surface of a fluorine resin to form a hydrophilized layer on the surface. The radical generated by the irradiation with the ultraviolet light having at least an intensity in a wavelength range of 205 nm or less is a radical composed of a carbon atom, a hydrogen atom, and an oxygen atom, and a hydrogen radical.

Equipment for irradiating with the ultraviolet light having at least an intensity in a wavelength range of 205 nm or less is smaller and plainer, i.e. simpler than a device for performing the methods described in PRIOR ART

DOCUMENTS

In irradiating with the ultraviolet light having at least an intensity in a wavelength range of 205 nm or less, the reactive gases as listed in PRIOR ART DOCUMENTS are not used.

Herein, the hydrophilization of the surface of the fluorine resin refers to a processing for enhancing the affinity of the surface with water molecules. The hydrophilized layer of the fluorine resin refers to a surface layer of the fluorine resin having higher affinity with the water molecules than the affinity of the fluorine resin with the water molecules. Although details will be described later, a radical generated from a radical source is used to replace a fluorine atom on the surface of the fluorine resin with a functional group composed of a carbon atom, a hydrogen atom, and an oxygen atom. Since the replaced functional group contains the oxygen atom and has polarity, the hydrophilicity of the surface of the fluorine resin is improved.

The organic compound may contain at least one of a hydroxy group, a carbonyl group, and an ether bond. Since the functional group containing at least one of a hydroxy group, a carbonyl group, and an ether bond can be formed on the surface of the fluorine resin, hydrophilicity can be imparted to the fluorine resin.

The organic compound may contain at least one selected from the group consisting of an alcohol, a ketone, an aldehyde, and a phenol. Since the functional group containing at least one of a hydroxy group, a carbonyl group, and an ether bond can be formed on the surface of the fluorine resin, high hydrophilicity can be imparted to the surface of the fluorine resin.

The organic compound may contain at least one selected from the group consisting of an alcohol having 10 or less carbon atoms and a ketone having 10 or less carbon atoms. Further, the organic compound may contain an alcohol having 2 or more and 4 or less carbon atoms. The alcohol having 2 or more and 4 or less carbon atoms is excellent in safety, ease of handling, easy availability, and economic efficiency. The organic compound may contain acetone. Acetone is excellent in easy availability and economic efficiency, and has a high vapor pressure, which makes it easy to form a relatively high concentration atmosphere.

The hydrophilized layer may be a layer substantially composed of a carbon atom, a hydrogen atom, and an oxygen atom.

The organic compound may be a gas.

The organic compound brought into contact with the surface of the fluorine resin may be irradiated with the ultraviolet light. As a result, since a relatively wide range of the surface of the fluorine resin can be irradiated with the ultraviolet light, a large region of the surface can be surface-modified in a short time. The radical is generated in the vicinity of the object to be processed, and therefore the generated radical is used with high efficiency.

The generated radical may be sprayed onto the surface of the fluorine resin. As a result, only a region requiring surface modification can be selectively processed. It is not necessary to purge an entire processing space with a radical source-containing gas.

The ultraviolet light may be generated by a xenon excimer lamp. A xenon excimer lamp having a peak wavelength of 172 nm is easily absorbed by the organic compound, and forms many radicals.

A surface-modified fluorine resin production method of the present invention includes the steps of: preparing a material having a surface having a fluorine resin provided thereon; irradiating an organic compound containing an oxygen atom with ultraviolet light having at least an intensity in a wavelength region of 205 nm or less to generate a radical; and bringing the radical into contact with a surface of the fluorine resin of the material to form a hydrophilized layer on the surface.

A material having a surface-modified fluorine resin of the present invention includes: a fluorine resin provided on a surface of the material; and a hydrophilized layer provided on at least a part of a surface of the fluorine resin, the hydrophilized layer composed of a functional group composed of a carbon atom, a hydrogen atom, and an oxygen atom.

A material containing at least one selected from the group consisting of a metal, a resin, and a ceramic may be joined to the hydrophilized layer. The material selected from the group consisting of a metal, a resin, and a ceramic contains a material containing a metal, a resin, or a ceramic selected alone, and a material containing at least two selected from a metal, a resin, and a ceramic. Since these materials may contain two or more kinds, they contain a material containing a combination of a metal, a resin, or a ceramic selected alone and a composite material. Examples of the materials include a material containing a combination of a metal and a composite material of a metal and a resin. At the time of joining the materials, the material containing at least one as described above may be directly joined to the hydrophilized layer, or may be joined to the hydrophilized layer with an adhesive layer interposed therebetween.

The material to be joined to the hydrophilized layer may be a metal, and the fluorine resin may be a circuit board material.

Effect of the Invention

As a result, it is possible to provide a fluorine resin surface modification method wherein an object to be processed and a processing device and the like are not readily damaged, wherefrom the risk of harmfully impacting a human body is small, and which can be carried out with simple equipment, a surface-modified fluorine resin production method, a joining method, a material having a surface-modified fluorine resin, and a joined body.

MODE FOR CARRYING OUT THE INVENTION

A fluorine resin surface modification method will be described in detail. It should be noted that the drawings disclosed herein merely show schematic illustrations except for graphs. Namely, the dimensional ratios on the drawings do not necessarily reflect the actual dimensional ratios, and the dimensional ratios are not necessarily the same between the drawings.

[Outline of Fluorine Resin Surface Modification Method]

A fluorine resin surface modification method includes the steps of: irradiating an organic compound containing an oxygen atom with ultraviolet light having at least an intensity in a wavelength range of 205 nm or less (hereinafter, may be simply referred to as "ultraviolet light") to generate a radical; and bringing the radical into contact with a surface of a fluorine resin to hydrophilize the surface.

The step of irradiating the organic compound containing an oxygen atom with ultraviolet light (hv) having at least an intensity in a wavelength range of 205 nm or less to generate a radical will be described with reference to chemical reaction formulas. Here, ethanol ($C_2H_5OH$) is taken as an example of the organic compound containing an oxygen atom.

[Formula 1]

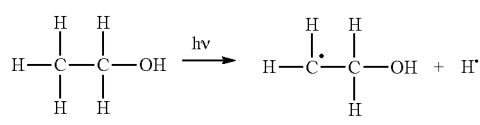

[Formula 2]

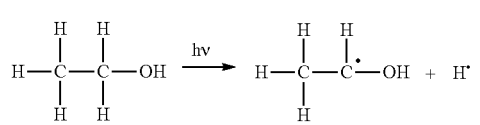

[Formula 3]

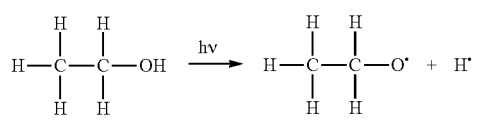

As shown in the above formulas (1) to (3), when ethanol is irradiated with the ultraviolet light (hv) having at least an intensity in a wavelength range of 205 nm or less, energy of the ultraviolet light breaks an interatomic bond to generate a radical composed of a carbon atom, a hydrogen atom, and an oxygen atom (sometimes referred to as a "{CHO} radical" or "{CHO}•") and a hydrogen radical (sometimes referred to as "H•"). The radical is an atom or molecule having an unpaired electron. The {CHO} radical includes radicalized C and radicalized O. Three types of {CHO} radicals shown in the above formulas (1) to (3) are formed depending on the difference between a fact that either C or O is radicalized and a fact that C at any position is radicalized. Not all the {CHO} radicals are generated in equal proportions.

Note that the three chemical reaction formulas shown in the above formulas (1) to (3) show a {CHO} radical having one atom having an unpaired electron. The irradiation with the ultraviolet light may generate a {CHO} radical having two or more atoms each having an unpaired electron.

Figure 1A:
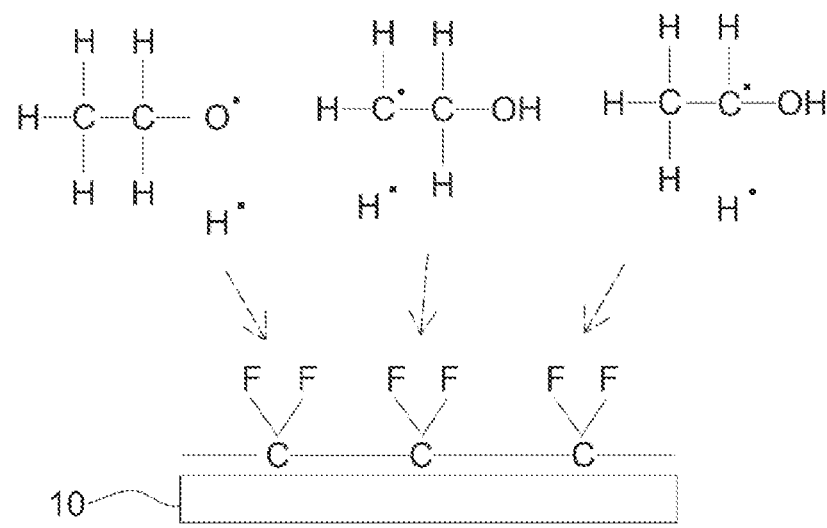
FIG. 1A is a schematic cross-sectional view of a fluorine resin immediately before surface modification using ethanol.
Figure 1B:
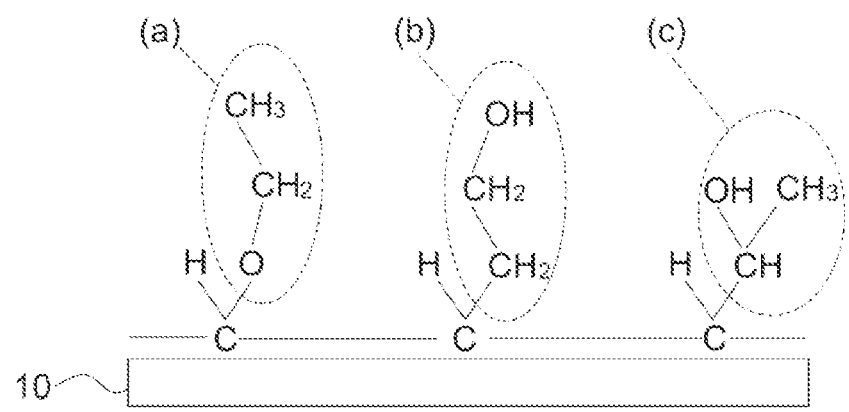
FIG. 1B is a schematic cross-sectional view of a fluorine resin after surface modification using ethanol.

Next, the step of bringing the radical generated by the irradiation with the ultraviolet light into contact with the surface of the fluorine resin to hydrophilize the surface will be described with reference to FIGS. 1A and 1B. FIG. 1A is a schematic cross-sectional view of a fluorine resin 10 (here, PTFE) showing a state immediately before surface modification of the fluorine resin 10. FIG. 1B is a schematic cross-sectional view of the fluorine resin 10 after surface modification of the fluorine resin 10 in FIG. 1A. FIGS. 1A and 1B show the chemical structure of the surface of the fluorine resin 10 so that the chemical structure can be understood.

As shown in FIG. 1A, a large number of fluorine atoms (F) bonded to carbon atoms (C) are present on the surface of the fluorine resin 10 before surface modification. Ethanol is radicalized by absorbing ultraviolet light. In the vicinity of the surface of the fluorine resin 10, {CHO} radicals generated from the ethanol and hydrogen radicals are present.

The fluorine atoms contained in the fluorine resin 10 are bonded to the carbon atoms. Bond energy between the carbon atom and the fluorine atom is as high as 485 KJ/mol, and very large energy is required to separate the fluorine atom and the carbon atom from each other by heat or light.

Here, the electronegativity of the fluorine atom is 4.0, and the electronegativity of a hydrogen atom is 2.2. Both the electronegativities are greatly different from each other. Therefore, electrostatic attraction allows the hydrogen radical to approach the fluorine atom to form HF (hydrogen fluoride), thereby breaking the bond between the fluorine atom and the carbon atom. Since bond energy between the hydrogen atom and the fluorine atom is as higher as 568 kJ/mol, and HF is separated from the surface of the fluorine resin as a gas, the generation reaction of the HF irreversibly proceeds. The {CHO} radical or the hydrogen radical is bonded to a place where fluorine has been extracted from the surface of the fluorine resin 10. A state after binding is shown in FIG. 1B.

FIG. 1B illustrates a state where six fluorine atoms are extracted, hydrogen radicals are bonded to three places among places of the six fluorine atoms, and {CHO} radicals are bonded to the remaining three places, but fluorine atoms may remain on the surface. The bond number of the hydrogen radicals may not be the same as that of the {CHO} radicals. For example, the {CHO} radicals may be bonded to all the positions where the fluorine atoms have been extracted. On at least a part of the surface of the fluorine resin 10, a functional group composed of a carbon atom, a hydrogen atom, and an oxygen atom (hereinafter, may be referred to as a "{CHO} functional group") is present.

In FIG. 1B, the {CHO} functional group shown in (a) is formed by bonding the {CHO} radical obtained from the formula (3) to the fluorine resin. In FIG. 1B, the {CHO} functional group shown in (b) is formed by bonding the {CHO} radical obtained from the formula (1) to the fluorine resin. In FIG. 1B, the {CHO} functional group shown in (c) is formed by bonding the {CHO} radical obtained from the formula (2) to the fluorine resin.

The {CHO} functional group bonded to the fluorine resin has polarity because it contains an oxygen atom. In FIG. 1B, each of the {CHO} functional groups shown in (b) and (c) has a hydroxy group at the terminal, and thus exhibits high hydrophilicity. In FIG. 1B, since the {CHO} functional group shown in (a) forms an ether bond with the fluorine resin, the {CHO} functional group is not as hydrophilic as a hydroxy group, but exhibits certain hydrophilicity. Thus, a hydrophilized layer substantially composed of a carbon atom, a hydrogen atom, and an oxygen atom is formed on the surface of the fluorine resin by the hydrogen radicals and the {CHO} radicals. Herein, the phrase "substantially composed of a carbon atom, a hydrogen atom, and an oxygen atom" means that atoms other than a carbon atom, a hydrogen atom, and an oxygen atom are not intentionally included. That is, this configuration may include atoms other than a carbon atom, a hydrogen atom, and an oxygen atom which are not intended.

Even when water or water vapor is irradiated with the ultraviolet light (hv) having at least an intensity in a wavelength range of 205 nm or less, the hydrogen radicals that break the bond between the fluorine atom and the carbon atom are generated. However, in the case of the water or the water vapor, hydroxy radicals are generated simultaneously with the hydrogen radicals. The hydroxy radicals are less likely to be bonded to the surface of the fluorine resin from which fluorine has been extracted, unlike the {CHO} radicals. Therefore, the water or the water vapor is less likely to be used as a radical supply source for hydrophilizing the surface of the fluorine resin. However, even if water or water vapor is contained in a region irradiated with light, the above-described hydrophilized layer can be formed as long as the organic compound containing an oxygen atom as a radical supply source is present.

Since the reaction for generating the {CHO} radical and the hydrogen radical from the organic compound containing an oxygen atom proceeds regardless of the pressure of a reaction field, the reaction field is not under a special environment such as a reduced pressure environment or a pressurized environment, and is usually under an atmospheric pressure environment in many cases. Further, the organic compound containing an oxygen atom may be in any state of a gas, a liquid, and a solid. However, from the viewpoint of the transmittance of ultraviolet rays, for appropriate irradiation with the ultraviolet rays, it is most desirable that the organic compound is supplied in a gaseous state. When the organic compound is in a liquid or solid state, a large amount of ultraviolet rays having a wavelength of 205 nm or less is absorbed by the surface layer of the organic compound, which makes it difficult to deliver the ultraviolet rays to the surface layer of the fluorine resin as the object to be processed. This makes it more difficult to generate/act radicals in the vicinity of the surface layer of the fluorine resin, and therefore the formation of the hydrophilized layer on the surface layer is inhibited. Therefore, the organic compound containing an oxygen atom is desired to be supplied in a gaseous state (gas state), and the processing efficiency can be enhanced by suitably adjusting the gas concentration.

[Organic Compound Containing Oxygen Atom]

In the above description, the ethanol has been described as an example of the organic compound containing an oxygen atom, but the hydrophilized layer can be formed on the fluorine resin also for the organic compound containing an oxygen atom other than the ethanol.

Figure 2A:
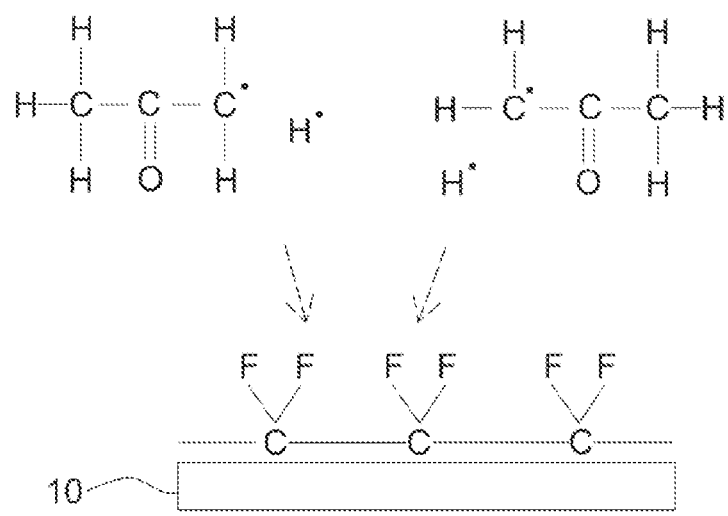
FIG. 2A is a schematic cross-sectional view of a fluorine resin immediately before surface modification using acetone.
Figure 2B:
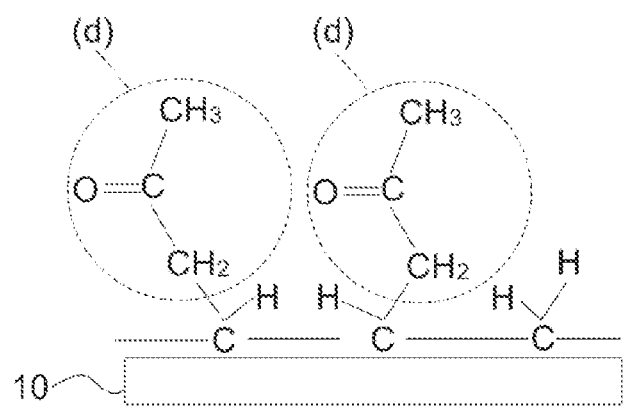
FIG. 2B is a schematic cross-sectional view of a fluorine resin after surface modification using acetone.

An example in which acetone is used as the organic compound containing an oxygen atom will be described with reference to FIGS. 2A and 2B. FIG. 2A is a schematic cross-sectional view of a fluorine resin 10 (here, PTFE) showing a state immediately before surface modification of the fluorine resin 10 as with FIG. 1A. FIG. 2B is a schematic cross-sectional view of the fluorine resin 10 after surface modification of the fluorine resin 10 in FIG. 2A.

The acetone is radicalized by absorbing ultraviolet light. In the vicinity of the surface of the fluorine resin 10, {CHO} radicals generated by irradiating the acetone with the ultraviolet light and hydrogen radicals are present. Electrostatic attraction causes the hydrogen radical to approach a fluorine atom to form HF (hydrogen fluoride), thereby breaking the bond between the fluorine atom and a carbon atom. The {CHO} radical or the hydrogen radical is bonded to a place where fluorine has been extracted from the surface of the fluorine resin 10. A state after binding is shown in FIG. 2B.

The {CHO} functional group ((d) in FIG. 2B) bonded to the fluorine resin has polarity because it contains an oxygen atom. When the acetone is used, the {CHO} functional group contains a carbonyl group, and thus exhibits hydrophilicity. Thus, a hydrophilized layer substantially composed of a carbon atom, a hydrogen atom, and an oxygen atom is formed on the surface of the fluorine resin by the hydrogen radicals and the {CHO} radicals.

Figure 3A:
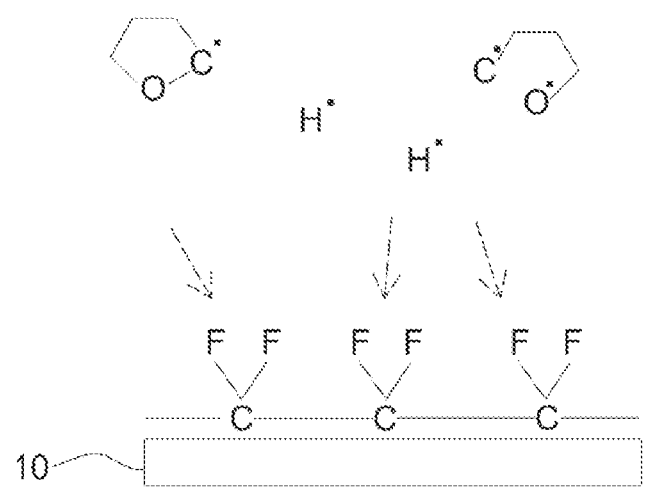
FIG. 3A is a schematic cross-sectional view of a fluorine resin immediately before surface modification using tetrahydrofuran.
Figure 3B:
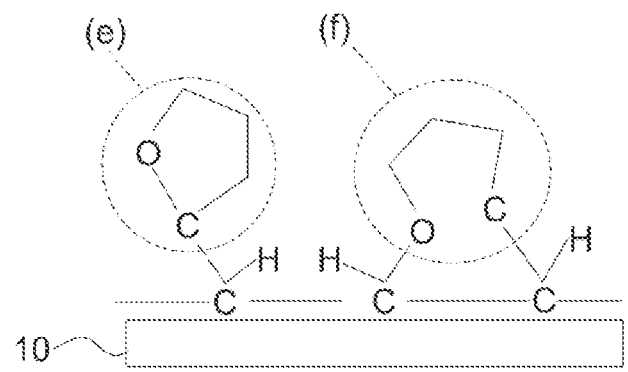
FIG. 3B is a schematic cross-sectional view of a fluorine resin after surface modification using tetrahydrofuran.

An example in which tetrahydrofuran is used as the organic compound containing an oxygen atom will be described with reference to FIGS. 3A and 3B. FIG. 3A is a schematic cross-sectional view of a fluorine resin 10 (here, PTFE) showing a state immediately before surface modification of the fluorine resin 10 as with FIG. 1A. FIG. 3B is a schematic cross-sectional view of the fluorine resin 10 after surface modification of the fluorine resin 10 in FIG. 3A.

The tetrahydrofuran is radicalized by absorbing ultraviolet light. In the vicinity of the surface of the fluorine resin 10, the {CHO} radicals generated by irradiating the tetrahydrofuran with the ultraviolet light and the hydrogen radicals are present. Electrostatic attraction causes the hydrogen radical to approach a fluorine atom to form HF (hydrogen fluoride), thereby breaking the bond between the fluorine atom and a carbon atom. The {CHO} radical or the hydrogen radical is bonded to a place where fluorine has been extracted from the surface of the fluorine resin 10. A state after binding is shown in FIG. 2B.

The {CHO} functional group ((e) and (f) in FIG. 3B) bonded to the fluorine resin has polarity because it contains an oxygen atom. When the tetrahydrofuran is used, the {CHO} functional group contains an ether bond, and thus exhibits certain hydrophilicity. Thus, a hydrophilized layer substantially composed of a carbon atom, a hydrogen atom, and an oxygen atom is formed on the surface of the fluorine resin by the hydrogen radicals and the {CHO} radicals.

As described above, the {CHO} functional group obtained from the organic compound containing an oxygen atom contains the oxygen atom, and therefore the organic compound has polarity, and can form the hydrophilized layer composed of the hydrogen atom and the oxygen atom.

Among the organic compounds containing an oxygen atom, an organic compound containing at least one of a hydroxy group, a carbonyl group, and an ether bond is particularly preferable. Further, an alcohol, a ketone, an aldehyde, and a phenol are suitably used. The alcohol and the phenol contain a hydroxy group, and therefore high hydrophilicity is exhibited on the surface of the fluorine resin as described above. The ketone and the aldehyde contain a carbonyl group, and therefore high hydrophilicity is exhibited on the surface of the fluorine resin.

Examples of the alcohol that can be used include not only monohydric alcohols such as methanol ($CH_3OH$), ethanol ($C_2H_5OH$) . . . but also polyhydric alcohols such as ethylene glycol and glycerin. The phenol is a general term for materials in which an OH group is bonded to an aromatic ring.

In consideration of safety, convenience of handling, easy availability, and economic efficiency, among the alcohols, an alcohol having 10 or less carbon atoms is preferable. In particular, an alcohol having 4 or less carbon atoms is more preferable. Among the ketones, ketones having 10 or less carbon atoms are preferable. Methanol having one carbon atom may have an adverse effect on the human body, and therefore a radical source is more preferably an alcohol having two or more carbon atoms. Therefore, an alcohol having 2 or more and 4 or less carbon atoms is preferable. Among the ketones, acetone is more preferable.

Other materials, for example, inert gases such as nitrogen and a rare gas may be supplied together with the organic compound containing an oxygen atom. Among the inert gases, nitrogen is preferable because it is excellent in easy availability and economic efficiency. The other materials supplied together with the organic compound containing an oxygen atom preferably do not contain a gas that easily absorbs ultraviolet light, but may contain a small amount of the gas that easily absorbs ultraviolet light. Examples of the gas that easily absorbs ultraviolet light include oxygen ($O_2$) gas. The concentration of the oxygen gas in an atmosphere irradiated with ultraviolet light is preferably 10,000 ppm or less, and preferably 1000 ppm or less.

[Ultraviolet Light]

The ultraviolet light with which the organic compound containing an oxygen atom is irradiated is ultraviolet light having at least an intensity in a wavelength range of 205 nm or less.

As used herein, the "ultraviolet light having at least an intensity in a wavelength range of 205 nm or less" is light having an emission band at 205 nm or less. Examples of such light include broad-wavelength light having an emission spectrum in which a peak emission wavelength at which the intensity is maximum is 205 nm or less and light having an emission spectrum in which a plurality of maximum intensities (a plurality of peaks) are observed at emission wavelengths and any one of the peaks is within a wavelength range of 205 nm or less. Further, the "ultraviolet light having at least an intensity in a wavelength range of 205 nm or less" also includes light having an emission spectrum in which the integrated intensity of light of 205 nm or less is at least 30% of the total integrated intensity.

Figure 4A:
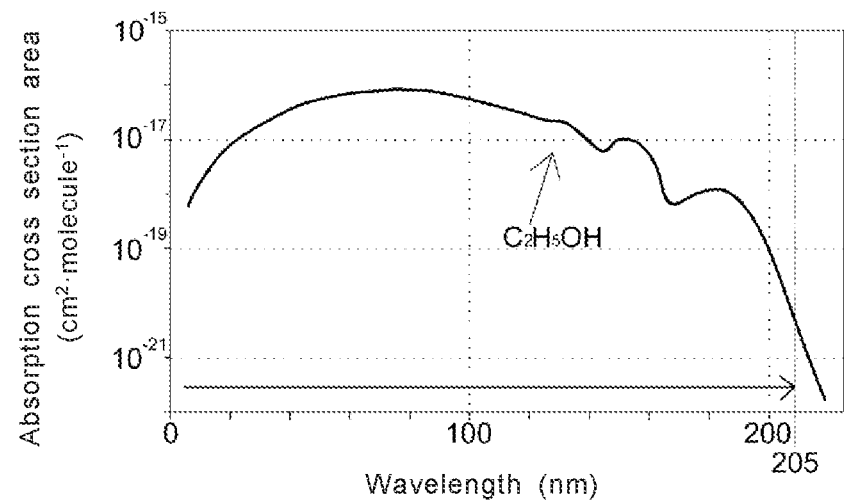
FIG. 4A shows an absorption spectrum of ultraviolet light for ethanol.
Figure 4B:
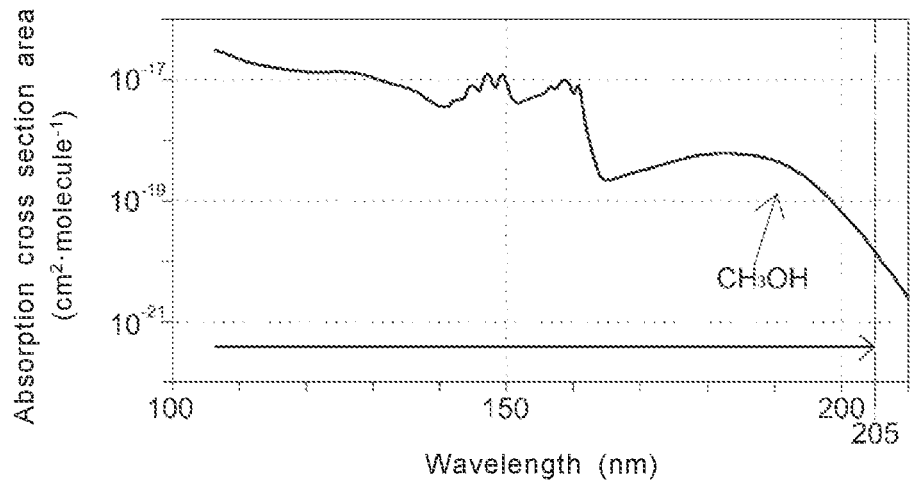
FIG. 4B shows an absorption spectrum of ultraviolet light for methanol.

A reason for using the ultraviolet light having at least an intensity in a wavelength range of 205 nm or less will be described with reference to FIGS. 4A and 4B. FIG. 4A shows an absorption spectrum of ultraviolet light for ethanol ($C_2H_5OH$). FIG. 4B shows an absorption spectrum of ultraviolet light for methanol ($CH_3OH$). In any of the absorption spectra of the organic compounds containing an oxygen atom, the wavelength is set so that the photon absorption cross section area per molecule is generally about $1 \times 10^{-20}$ ($cm^2 \cdot molecule^{-1}$) or more. This is based on the fact, found by the present inventor as a result of intensive studies, that irrespective of the type of radical source, ultraviolet light having a wavelength at which the photon absorption cross section area per molecule is about $1 \times 10^{-20}$ ($cm^2 \cdot molecule^{-1}$) or more generally has an absorption ability capable of efficiently generating radicals from the radical source. More preferably, ultraviolet light having a wavelength of 200 nm or less is set so that the photon absorption cross section area per molecule is $1 \times 10^{-19}$ ($cm^2 \cdot molecule^{-1}$) or more.

Although the ethanol and the methanol are shown in FIGS. 4A and 4B, even in the case of an organic compound containing an oxygen atom other than the ethanol and the methanol, it is effective to easily absorb light when light in a wavelength range of 205 nm or less is used.

[Fluorine Resin]

As the fluorine resin, in addition to the above-described PTFE, various materials such as a perfluoroalkoxy (PFA) fluorine resin, an ethylene tetrafluoroethylene (ETFE) copolymer, tetrafluoroethylene hexafluoropropylene (FEP) copolymer, and polyvinylidene fluoride (PVDF) can be used. A product composed of a fluorine resin alone, such as a plate or a film made of a fluorine resin may be used, or a composite in which a fluorine resin is provided on the surface of other material as a base material may be used. A "material having a surface having a fluorine resin provided thereon" refers to both a fluorine resin alone and a composite in which a fluorine resin is provided on the surface of at least a part of a material as a base material. The application of the fluorine resin is not particularly limited. For example, the fluorine resin may be used as a circuit board material, or may be used for medical use.

[Advantages of Hydrophilized Layer]

The hydrophilized layer having the {CHO} functional group is provided on the fluorine resin using the ultraviolet light, which makes it possible to significantly increase the wettability of the surface of the fluorine resin (significantly decrease a contact angle). As a result, a material that has been conventionally less likely to be bonded to the fluorine resin can be bonded to the fluorine resin. By pressing the other material against the hydrophilized layer of the fluorine resin surface-modified using the ultraviolet light, a strong intermolecular force such as a covalent bond or a hydrogen bond is generated between the {CHO} functional group of the hydrophilized layer and the surface of the other member, and therefore the fluorine resin and the other member can be bonded without using an adhesive or the like. The surface of the other member may also be surface-modified as described above to impart the {CHO} functional group. As a result, firm joining can be provided. Heating may be performed during pressing. The heating makes it possible to promote the formation of the covalent bond or the strong intermolecular force. In some cases, an adhesive may be used to provide the firm joining. Since the covalent bond or the strong intermolecular force is also generated between the {CHO} functional group and the adhesive, a joining force is improved even when the adhesive is used.

Examples of the other material bonded to the fluorine resin include a metal, a resin, a ceramic, and a composite material containing them (the metal, the resin, or the ceramic). The resin includes a fluorine resin.

When the fluorine resin is used as the circuit board material, a conductive metal may be used as a material to be bonded to the hydrophilized layer.

Figure 5A:
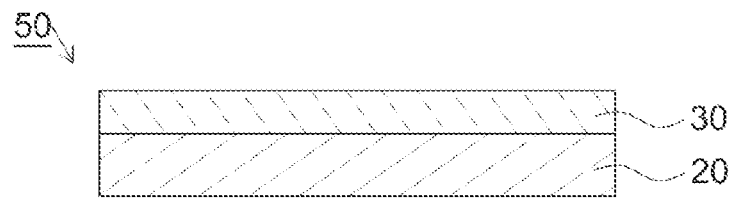
FIG. 5A shows an example of a joined body obtained by joining a surface-modified fluorine resin and a copper foil to each other.

FIG. 5A shows an example of a joined body obtained by joining a surface-modified fluorine resin and a copper foil to each other. A copper foil 30 is laminated on a fluorine resin film 20 including the hydrophilized layer provided by the above-described surface modification method, followed by pressing. Then, a strong intermolecular force is generated between the {CHO} functional group of the hydrophilized layer and the copper foil, and therefore the fluorine resin film 20 and the copper foil 30 are joined to each other. A joined body 50 thus obtained can be used as the circuit board material. When the fluorine resin film 20 and the copper foil 30 are pressed under high temperature and high pressure, the joining force is further increased.

Figure 5B:
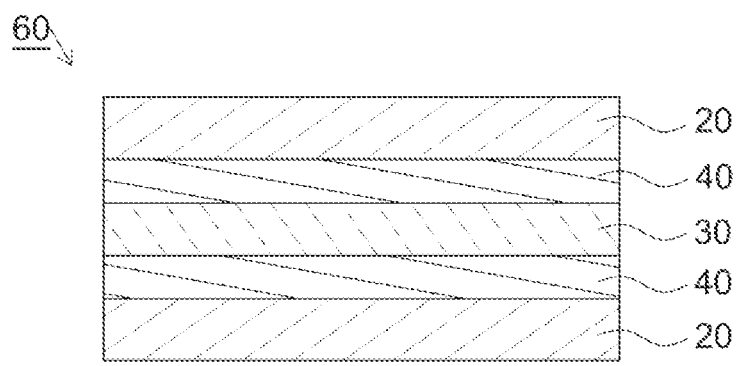
FIG. 5B shows an example of a joined body obtained by joining a surface-modified fluorine resin and a copper foil with an adhesive interposed therebetween.

FIG. 5A shows an example of a joined body obtained by directly joining the surface-modified fluorine resin film 20 and the copper foil 30 to each other, but FIG. 5B shows an example of a joined body obtained by joining the surface-modified fluorine resin and the copper foil to each other with an adhesive interposed therebetween. An adhesive layer 40 is formed on the hydrophilized layer of the fluorine resin film 20 including the hydrophilized layer provided by the above-described surface modification method by applying a film-like adhesive or applying an adhesive. The fluorine resin film 20 including the adhesive layer 40 formed thereon is applied to each of both surfaces of the copper foil 30 so as to sandwich the adhesive layer 40 between the fluorine resin films 20. As a result, a joined body 60 in which the copper foil 30 is sandwiched between the fluorine resin films 20 is formed. The joined body 60 thus obtained can be used as the circuit board material. The joining using the adhesive makes it easy to provide a high joining force without pressing at a high temperature or a high pressure. As the adhesive, an adhesive having a low dielectric constant and a low dielectric loss tangent may be used.

When the joined bodies (50, 60) exemplified in FIGS. 5A and 5B are used as the circuit board material, the joined bodies (50, 60) can be used as, for example, a flexible printed wiring board (FPC) for high-speed communication. Further, a conductive member such as copper may be formed in a pattern shape on the surface of the surface-modified fluorine resin.

First Embodiment

Figure 6:
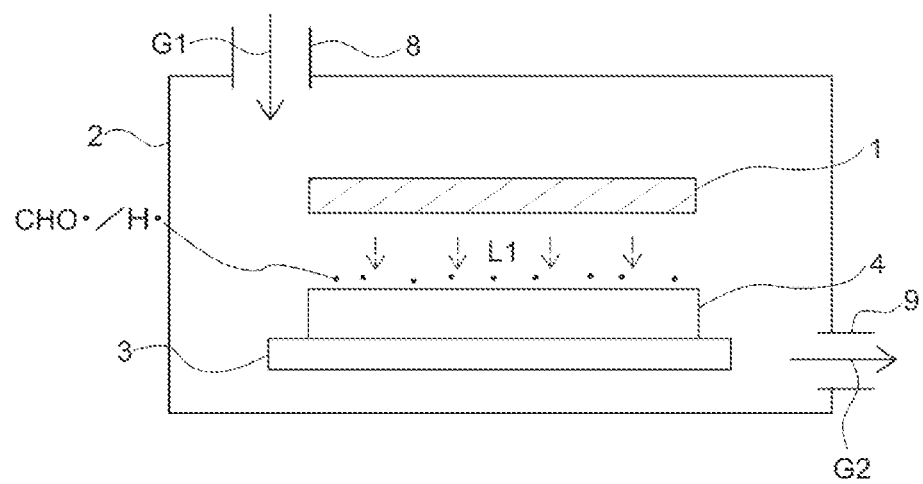
FIG. 6 shows a first embodiment of a surface modification method.

With reference to FIG. 6, a first embodiment of a surface modification method will be described.

On a stage 3 of a processing chamber 2 having, in the inside thereof, a light source 1 (hatched area) that emits ultraviolet light, an object 4 to be processed is disposed. The object 4 to be processed may be a plate-shaped fluorine resin alone, or may be a material having a fluorine resin layer on at least a surface facing the light source 1.

A gas (hereinafter, may be referred to as a "radical source-containing gas") G1 containing an organic compound (hereinafter, may be referred to as a "radical source") containing an oxygen atom is supplied from an inlet pipe 8 connected to the processing chamber 2, and an atmosphere gas G2 in the processing chamber 2 is discharged from an outlet pipe 9 to replace (purge) the atmosphere gas G2 in the processing chamber 2 with the radical source-containing gas G1. In this embodiment, the radical source-containing gas G1 contains an inert gas in addition to a gas of an organic compound containing an oxygen atom.

After the inside of the processing chamber 2 is purged with the radical source-containing gas G1, ultraviolet light L1 (shown by a dashed arrow in the drawing) is emitted to apply light energy to the radical source-containing gas G1 in the processing chamber 2, thereby generating {CHO} radicals and hydrogen radicals. Fluorine atoms are extracted from the surface of the fluorine resin by the hydrogen radicals, and the {CHO} radicals are bonded to the surface from which the fluorine atoms have been extracted, and therefore a hydrophilized layer having a {CHO} functional group is formed on the surface of the fluorine resin.

In this embodiment, a relatively wide range of the surface of the fluorine resin can be irradiated with ultraviolet light, and therefore a large region can be surface-modified in a short time. Radicals are generated in the vicinity of the object 4 to be processed, and therefore the generated radicals are used with high efficiency.

The ultraviolet light L1 is absorbed by the radical source-containing gas G1, and therefore the object 4 to be processed is disposed to be not too far away from the light source 1 so that radicals are generated by the ultraviolet light L1 in the vicinity of the object 4 to be processed. If the object 4 to be processed is too close to the light source 1, the amount of the radical source-containing gas G1 that absorbs light is reduced, and therefore the object 4 to be processed is disposed so as not to be too close to the light source 1. That is, the object 4 to be processed is separated from the light source 1 to the extent that radicals are generated by the ultraviolet light L1 and the generated radicals can be brought into contact with the surface of the object 4 to be processed.

During the surface modification, the ultraviolet light L1 may be emitted while the radical source-containing gas G1 is continuously supplied to the processing chamber 2 or the ultraviolet light L1 may be emitted in a state where the supply of the radical source-containing gas G1 is stopped by disconnecting an inlet pipe 8 and an outlet pipe 9 from the processing chamber 2 by valves or the like.

The light source 1 is a light source that emits ultraviolet light having at least an intensity in a wavelength range of 205 nm or less. Examples of such a light source include a xenon excimer lamp having a peak wavelength of 172 nm, an ArF excimer lamp having a peak wavelength of 193 nm, a Kr excimer lamp having a peak wavelength of 146 nm, and a low-pressure mercury lamp having a peak wavelength of 185 nm. In particular, when considered from each absorption coefficient of an organic compound containing an oxygen atom, the light source having a peak wavelength of 172 nm has a higher light absorption rate than that of the light source having a peak wavelength of 193 nm, and is preferable as a light source to be used. For example, when ethanol is selected as the organic compound, an absorption cross section area at a wavelength of 193 nm is $4.7 \times 10^{-19}$ $cm^2$, whereas an absorption cross section area at a wavelength of 172 nm is $7.1 \times 10^{-19}$ $cm^2$, and a light absorption rate is increased to about 1.5 times.

As the light source 1, it is desirable to use an excimer lamp capable of generating ultraviolet rays close to a single wavelength. It is also possible to consider a light source such as a gas laser as a light source having a wavelength of 205 nm or less, but a laser light source makes it difficult to uniformly process a large area, which causes processing unevenness. In particular, when the surface layer of the fluorine resin is uniformly processed in this application, it is practically difficult to use the laser light source. When the excimer lamp is used as the light source 1, the excimer lamp is particularly capable of uniformly processing a large area, and is excellent in characteristics of instantaneous lighting, and therefore the excimer lamp is the most excellent light source for this application.

Figure 7:
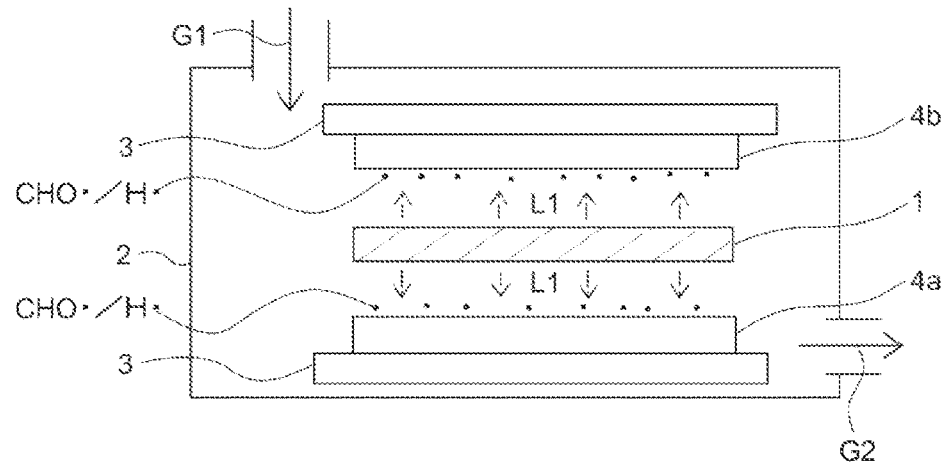
FIG. 7 shows a modification of the first embodiment of the surface modification method.

FIG. 7 shows a modification of the first embodiment. Two objects (4a, 4b) to be processed are disposed with the light source 1 interposed therebetween. The two objects (4a, 4b) to be processed can be simultaneously surface-modified.

In FIG. 7, the two objects (4a, 4b) to be processed are disposed to be equidistant from the light source 1 to achieve a uniform surface modification speed. It is to be noted that the two objects (4a, 4b) to be processed do not necessarily need to be disposed at the same distance from the light source 1.

Second Embodiment

Figure 8:
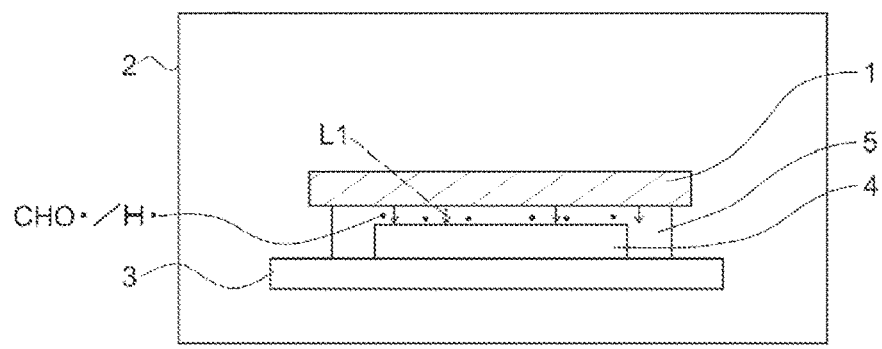
FIG. 8 shows a second embodiment of the surface modification method.

A second embodiment of the surface modification method will be described with reference to FIG. 8. The second embodiment can be implemented in the same manner as the first embodiment except for the following points. In FIG. 8, a liquid containing an organic compound containing an oxygen atom (hereinafter, may be referred to as a "radical source-containing solution") 5 is supplied so as to cover an object 4 to be processed. For example, when the organic compound containing an oxygen atom is liquid at ordinary temperature and pressure, the surface of the object 4 to be processed is wetted by pouring the radical source-containing solution 5 onto the object 4 to be processed or a liquid film is formed from the radical source-containing solution 5 on the object 4 to be processed. In this embodiment, the radical source-containing solution 5 is supplied so as to fill a space between the object 4 to be processed and the light source 1 therewith. Before the light source 1 is turned on, the radical source-containing solution 5 may be supplied onto the object 4 to be processed through a supply nozzle not shown in the processing chamber 2. Alternatively, the object 4 to be processed that is wetted (alternatively, has a liquid film formed thereon) by supplying the radical source-containing solution 5 onto the object 4 to be processed in the outside of the processing chamber 2 may be carried into the processing chamber 2. Here, the inside of the processing chamber 2 is preferably filled with an inert gas such as nitrogen gas or a noble gas as an atmosphere gas. The space between the object 4 to be processed and the light source 1 may not be filled with the radical source-containing solution 5.

As described above, the organic compound containing an oxygen atom may be a solid. When the organic compound containing an oxygen atom is the solid, the solid may be disposed on the object 4 to be processed. However, the solid is required to have a thickness that allows ultraviolet light to pass through the solid and reach the surface of a fluorine resin. The thickness of such a solid varies depending on the materials, but is preferably, for example, 0.1 mm or less.

Examples of the solid organic compound containing an oxygen atom include a radical source such as phenol which exists as a solid at normal temperature and normal pressure, a radical source containing an alcohol having a large number of carbon atoms, a radical source which exists as a solid at low temperature or high pressure (on the premise that the inside of the processing chamber is brought into a low temperature or high pressure environment), and an alcohol gelled by adding soap or oil or the like.

Third Embodiment

Figure 9:
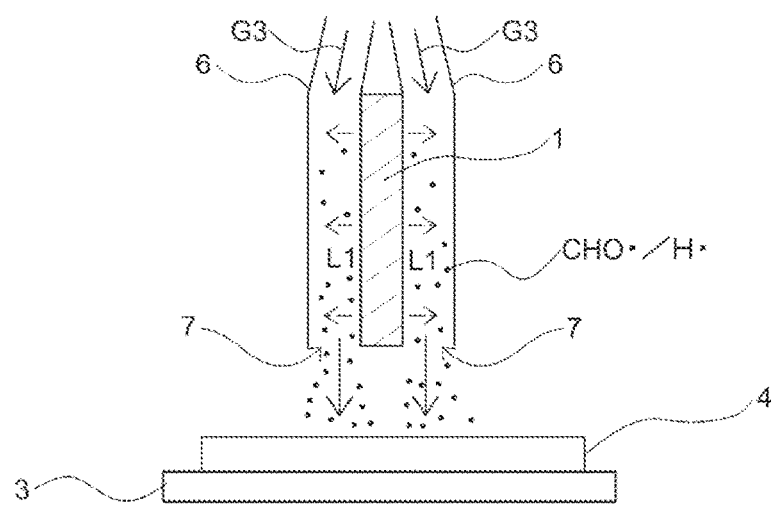
FIG. 9 shows a third embodiment of the surface modification method.

A third embodiment of the surface modification method will be described with reference to FIG. 9. The third embodiment can be implemented in the same manner as the first embodiment and the second embodiment except for the following points. In FIG. 9, a gas G3 is a radical source-containing gas. The radical source-containing gas G3 passing through the pipes 6 is irradiated with ultraviolet light L1 from a light source 1 disposed outside pipes 6, through which a radical source-containing gas G3 flows, to apply light energy to a radical source contained in the radical source-containing gas G3, thereby generating {CHO} radicals and hydrogen radicals. Then, the gas containing the {CHO} radicals and the hydrogen radicals is sprayed onto the surface of the object 4 to be processed from tips 7 of the pipes 6. When the hydrogen radicals and the {CHO} radicals are brought into contact with the surface of the fluorine resin, fluorine atoms on the surface of an object 4 to be processed are replaced by {CHO} functional groups, to form a hydrophilized layer. In this embodiment, only an area requiring surface modification can selectively be processed by relative displacement between the object 4 to be processed and the tips 7 while the distance between the object 4 to be processed and the tips 7 of the pipes 6 is maintained. In this embodiment, an entire processing space surrounded by a chamber or the like may not be purged with the radical source-containing gas G3.

In this embodiment, the light source 1 is interposed between the pipes 6. However, the position of the light source 1 is not limited thereto. For example, the light source 1 may be inserted in the center of a pipe without contact with the inner wall of the pipe, or a plurality of light sources may surround one or more pipes. Further, in this embodiment, the light source 1 is disposed in the vicinity of the tips 7 of the pipes 6. However, the light source 1 may be disposed at the pipes 6 to be far away from the tips 7. This embodiment can be used when an organic compound containing an oxygen atom is fluid.

The first embodiment, the second embodiment, and the third embodiment have been described above. However, the present invention is not limited to the above embodiments, and various changes or modifications may be made to the above embodiments without departing from the spirit of the present invention. Further, the first embodiment and the third embodiment may be combined to perform irradiation of the radical source (organic compound containing an oxygen atom) with the ultraviolet light both before and after bringing the radical source into contact with the surface of the object to be processed. This makes it possible to increase the generation efficiency of radicals.

EXAMPLES

Example 1

A fluorine resin was surface-modified by the surface modification method of the first embodiment (FIG. 6). PTFE (polytetrafluoroethylene) manufactured by Yodogawa Hu-Tech Co., Ltd. was prepared as an object 4 to be processed, and disposed in a processing chamber 2 at an interval of 1 mm from a light source 1. As the light source 1, a xenon excimer lamp having a peak wavelength of 172 nm was used. Irradiance on the surface of the light source 1 is 43 mW/cm$^2$.

20 mL of an organic compound (radical source) containing an oxygen atom at a concentration of 99.5 vol % was prepared as the radical source. Nitrogen gas was fed at 2 L/min into the radical source, followed by bubbling to produce a radical source-containing gas G1 in which vapor of the radical source was contained in the nitrogen gas. The produced radical source-containing gas G1 was fed into the processing chamber 2. Ethanol was used as the radical source.

By feeding the radical source-containing gas G1, an atmospheric gas such as air originally present in the processing chamber 2 was discharged from the processing chamber 2. An oxygen concentration meter (JKO-25 Ver. 3 manufactured by ICHINEN JIKCO LTD.) not shown is connected to an outlet of the processing chamber 2. When an oxygen gas concentration in the concentration meter reached almost 0% after the start of feeding of the radical source-containing gas G1, the atmosphere gas in the processing chamber 2 was determined to be substantially replaced by the radical source-containing gas G1, and an ultraviolet light lamp is turned on to surface-modify the PTFE.

The water contact angle of the object to be processed was measured by a contact angle meter (DMs-401 manufactured by Kyowa Interface Science Co., Ltd.) for each of different processing times of the surface modification (irradiation time of ultraviolet light) of 0 second, 60 seconds, and 120 seconds. When the processing time is 0 second, the water contact angle of the unprocessed object to be processed (surface of PTFE) is represented. The water contact angle was measured by calculating the contact angle from the measurement result of the contact angle meter by a curve fitting method of an ellipse. The contact angle was calculated at each of three points on the surface of the same object 4 to be processed, and the water contact angles measured at the three points were averaged to determine a final water contact angle. The other measurement conditions of the water contact angle were set in accordance with JIS R 3257 "Method for Testing Wettability of Substrate Glass Surface". The measurement results are shown in Table 1.

Example 2

Isopropyl alcohol (IPA) was used as a radical source. The other conditions (flow rate of nitrogen gas, irradiation conditions, and measurement conditions and the like) are the same as those in Example 1. The measurement results are shown in Table 1.

Example 3

Acetone was used as a radical source. The other conditions (flow rate of nitrogen gas, irradiation conditions, and measurement conditions and the like) are the same as those in Example 1. The measurement results are shown in Table 1.

Example 4

Tetrahydrofuran was used as a radical source. The other conditions (flow rate of nitrogen gas, irradiation conditions, and measurement conditions and the like) are the same as those in Example 1. The measurement results are shown in Table 1.

Example 5

Perflufluoroalkoxy alkane (PFA) manufactured by Nichias Corporation was used as an object 4 to be processed, and ethanol was used as a radical source. The other conditions (flow rate of nitrogen gas, irradiation conditions, and measurement conditions and the like) are the same as those in Example 1. The measurement results are shown in Table 1.

Example 6

Isopropyl alcohol (IPA) was used as a radical source. The other conditions (flow rate of nitrogen gas, irradiation conditions, and measurement conditions and the like) are the same as those in Example 5. The measurement results are shown in Table 1.

Example 7

Acetone was used as a radical source. The other conditions (flow rate of nitrogen gas, irradiation conditions, and measurement conditions and the like) are the same as those in Example 5. The measurement results are shown in Table 1.

Example 8

Tetrahydrofuran was used as a radical source. The other conditions (flow rate of nitrogen gas, irradiation conditions, and measurement conditions and the like) are the same as those in Example 5. The measurement results are shown in Table 1.

COMPARATIVE EXAMPLES

As examples of a gas not containing an organic compound containing an oxygen atom, results of feeding only nitrogen gas at 2 L/min and irradiating with the ultraviolet light under the nitrogen gas atmosphere is shown in Table 1 as Comparative Examples. In Comparative Example 1, PTFE manufactured by Yodogawa Hu-Tech Co., Ltd. is used as an object 4 to be processed, and in Comparative Example 2, PFA manufactured by Nichias Corporation is used as an object 4 to be processed. The other processing conditions are the same as those in Examples.

TABLE 1

| Examples/Processing time | 0 sec. | 60 sec. | 120 sec. |
|---|---|---|---|
| Example 1 | 115 degrees | 83 degrees | 50 degrees |
| Example 2 | 115 degrees | 85 degrees | 73 degrees |
| Example 3 | 115 degrees | 101 degrees | 68 degrees |
| Example 4 | 115 degrees | 99 degrees | 97 degrees |
| Example 5 | 110 degrees | 80 degrees | 54 degrees |
| Example 6 | 110 degrees | 83 degrees | 68 degrees |
| Example 7 | 110 degrees | 86 degrees | 57 degrees |
| Example 8 | 110 degrees | 102 degrees | 91 degrees |
| Comparative Example 1 | 115 degrees | 112 degrees | 111 degrees |
| Comparative Example 2 | 110 degrees | 111 degrees | 111 degrees |

As shown from the above Table, it was found that as the processing time for surface modification (irradiation time of ultraviolet light) increases, the contact angle decreases, and the hydrophilization proceeds. In particular, it was found that when ethanol (Examples 1 and 5) is used, the hydrophilization remarkably proceeds.

[XPS Analysis]

The surface of the fluorine resin surface-modified by the surface modification method of the first embodiment (FIG. 6) was analyzed by X-ray photoelectron spectroscopy (XPS). For the XPS, PHI Quantera SXM manufactured by ULVAC-PHI, Inc. was used. In the surface modification method of this analysis, ethanol is used as the organic compound containing an oxygen atom, and PTFE manufactured by Yodogawa Hu-Tech Co., Ltd. is used as the object 4 to be processed.

Figure 10A:
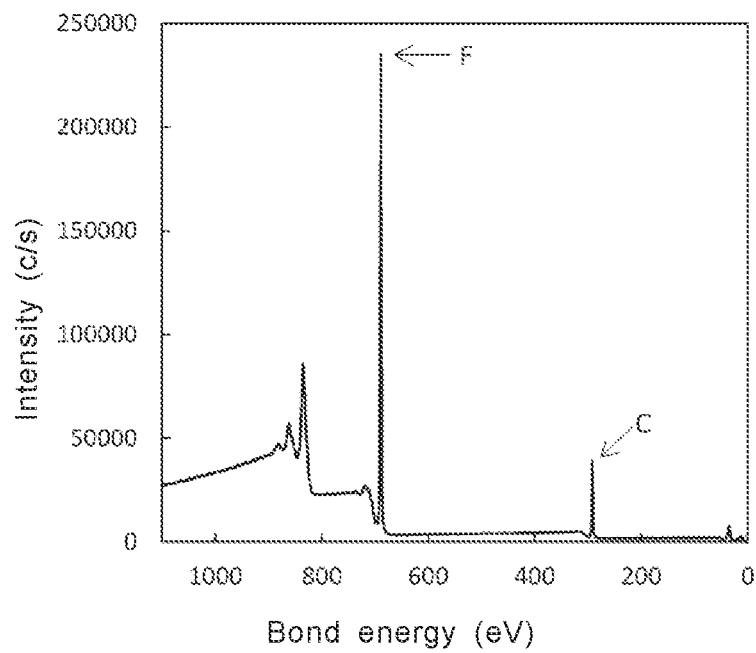
FIG. 10A is a graph showing XPS survey analysis results of a fluorine resin in a processing time of 0 second.
Figure 10B:
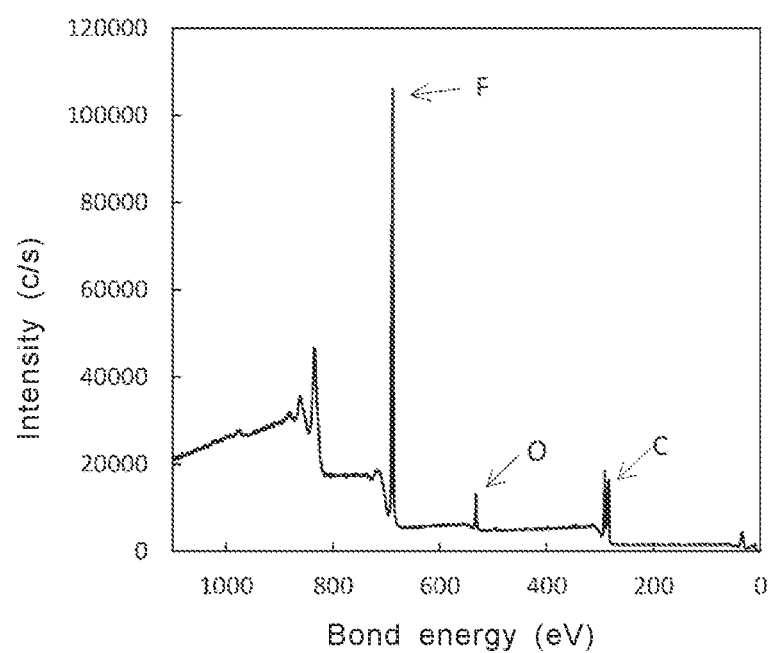
FIG. 10B is a graph showing XPS survey analysis results of a fluorine resin in a processing time of 60 seconds.
Figure 10C:
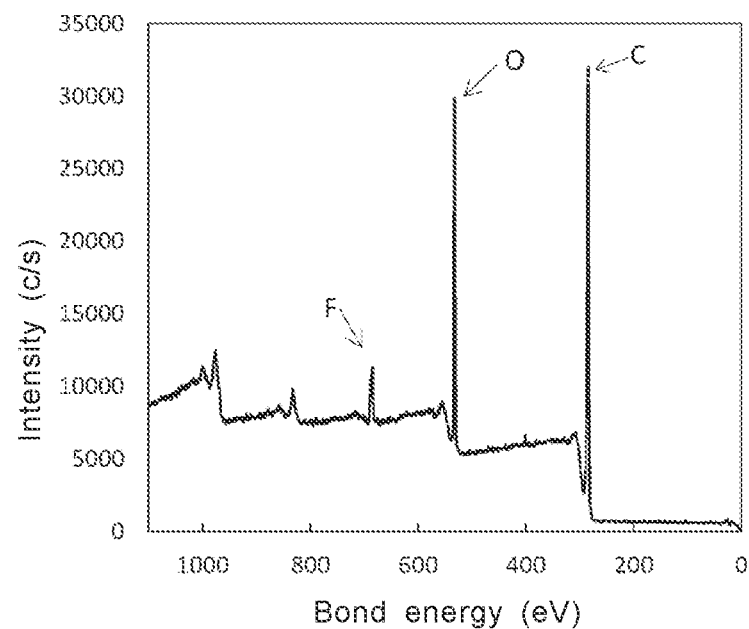
FIG. 10C is a graph showing XPS survey analysis results of a fluorine resin in a processing time of 120 seconds.

FIGS. 10A to 10 C are graphs showing results of XPS survey analysis (wide scan analysis) of the surface of the fluorine resin based on the above-described surface modification method. FIG. 10A is an analysis result of the surface of a (unprocessed) fluorine resin in a surface modification processing time of 0 second. FIG. 10B is an analysis result of the surface of a fluorine resin in a surface modification processing time of 60 seconds. FIG. 10C is an analysis result of the surface of a fluorine resin in a surface modification processing time of 120 seconds. In each graph, a horizontal axis represents bond energy, and a vertical axis represents the intensity (unit: c/s) of a measured photoelectron spectrum.

As shown in FIG. 10A, from the surface of the unprocessed fluorine resin, an F atom peak (indicated by "F" in the drawing, the same applies hereinafter) and a C atom peak (indicated by "C" in the drawing, the same applies hereinafter) were mainly detected. The atomic percentages of atoms in the unit volume of the surface of the unprocessed fluorine resin were C: 32.9 at % and F: 67.1 at %. As shown in FIG. 10B, from the surface of the fluorine resin in the processing time of 60 seconds, an F atom peak, a C atom peak, and an O atom peak (indicated by "O" in the drawing, the same applies hereinafter) were mainly detected. The atomic percentages of atoms in the unit volume of the surface of the fluorine resin in the processing time of 60 seconds were C: 51.4 at %, 0:5.4 at %, and F: 43.2 at %. As shown in FIG. 10C, from the surface of the fluorine resin in the processing time of 120 seconds, a C atom peak and an O atom peak were mainly detected. The atomic percentages of atoms in the unit volume of the surface of the fluorine resin in the processing time of 120 seconds were C: 77.2 at %, O: 18.6 at %, and F: 4.2 at %. Therefore, it was confirmed that, on the surface of the fluorine resin, the detection amount of fluorine decreases and the detection amounts of carbon and oxygen increase as the surface modification time increases. Since hydrogen atoms are difficult to detect by XPS, they are excluded from detection targets.

The XPS usually has a detection depth of 4 to 5 nm. Therefore, it is considered that, on the outermost surface of the fluorine resin, the detection amount of the fluorine is further reduced as compared with the measurement result, and the detection amounts of carbon and oxygen increase. The components of the nitrogen gas contained in the radical source-containing gas G1 are hardly detected from the surface of the fluorine resin.

Figure 11A:
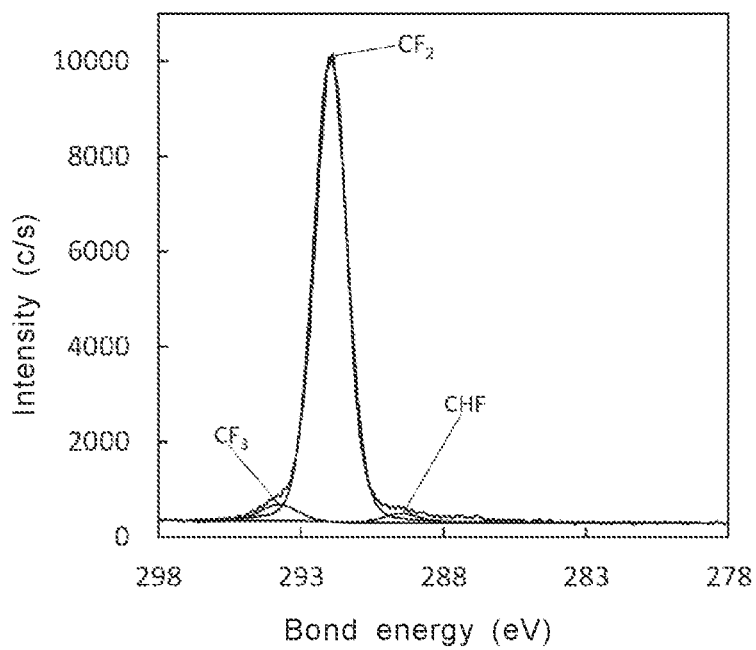
FIG. 11A is a graph showing XPS narrow analysis results of a fluorine resin in a processing time of 0 second.
Figure 11B:
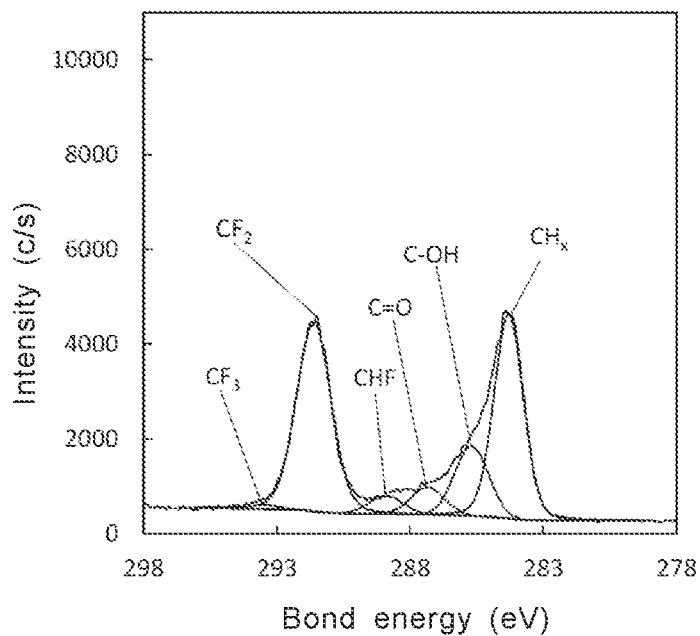
FIG. 11B is a graph showing XPS narrow analysis results of a fluorine resin in a processing time of 60 seconds.
Figure 11C:
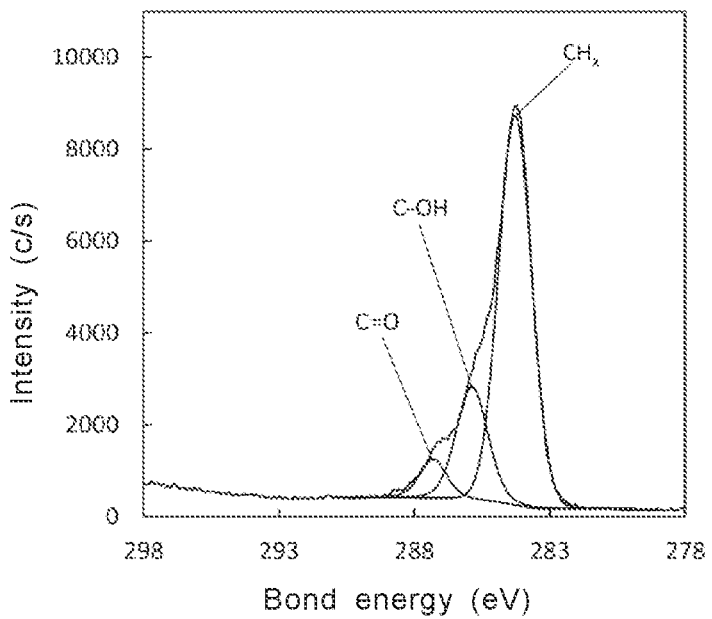
FIG. 11C is a graph showing XPS narrow analysis results of a fluorine resin in a processing time of 120 seconds.

FIGS. 11A to 11C are graphs showing results of XPS narrow scan analysis of the vicinity of the peak position of C1s of the surface of the fluorine resin based on the above-described surface modification method. FIG. 11A is an analysis result of the surface of a (unprocessed) fluorine resin in a processing time of 0 second. FIG. 11B is an analysis result of the surface of a fluorine resin in a processing time of 60 seconds. FIG. 11C is an analysis result of the surface of a fluorine resin in a processing time of 120 seconds. In each graph, a horizontal axis represents bond energy (unit: eV), and a vertical axis represents the intensity (unit: c/s) of a measured photoelectron.

From FIG. 11A, in the processing time of 0 second (unprocessed), a peak centered at 292 eV (designated as "$CF_2$" in the drawing), a peak centered at 294 eV (designated as "$CF_3$" in the drawing), and a peak centered at 289 eV (designated as "CHF" in the drawing) are observed. These results indicate that the surface of the fluorine resin has many C—F bonds. In the processing time of 60 seconds, a peak at 292 eV of a $CF_2$ bond decreases, and a peak of a C—H bond centered at 284 eV (designated as "$CH_x$" in the drawing), a peak of a C—OH bond centered at 286 eV (designated as "C—OH" in the drawing), and a peak of a C=O bond centered at 287 eV (designated as "C=O" in the drawing) are observed. Further, in the processing time of 120 seconds, a peak of a C—F bond is not observed, and the $CH_x$ bond, the C—OH bond, and the C=O bond tend to increase. That is, it is confirmed that as the surface modification time increases, the number of C—F bonds decreases, whereas the number of the C—H bonds and the number of the C—O bonds increase on the surface of the fluorine resin. It is considered that, when the C—OH is generated by the main reaction, a part of the C—OH is oxidized by oxygen or water vapor contained in a trace amount in the atmosphere to generate the C=O bond.

As described above, when the peak of the C—H bond, the peak of the C—OH bond, or the peak of the C=O bond or the like is confirmed on the surface of the fluorine resin from the results of XPS narrow scan analysis in the vicinity of the peak position of C1s on the surface of the fluorine resin, a hydrophilized layer different from the fluorine resin can be determined to be formed on the surface of the fluorine resin.

DESCRIPTION OF REFERENCE SIGNS

1 Light source
2 Processing chamber
3 Stage
4 Object to be processed
5 Radical source-containing solution
6 Pipe
7 Tip
8 Inlet pipe
9 Outlet pipe
10 Fluorine resin
20 Fluorine resin film
30 Copper foil
40 Adhesive layer
50, 60 Joined body
G1 Radical source-containing gas
G2 Atmosphere gas
G3 Radical source-containing gas
L1 Ultraviolet light

The invention claimed is:

1. A fluorine resin surface modification method comprising the steps of:
   irradiating an organic compound containing an oxygen atom with ultraviolet light having at least an intensity in a wavelength range of 205 nm or less, while the organic compound containing the oxygen atom is continuously supplied in gaseous form, to generate a radical; and
   bringing the radical into contact with a surface of a fluorine resin to form a hydrophilized layer on the surface, wherein the fluorine resin, after the process of forming the hydrophilized layer on the surface, has the surface which has a peak intensity of carbon atoms and a peak intensity of oxygen atoms that are higher than a peak intensity of fluorine atoms in a photoelectron spectrum by XPS survey analysis.

2. The fluorine resin surface modification method according to claim 1, wherein the organic compound contains at least one of a hydroxy group, a carbonyl group, and an ether bond.

3. The fluorine resin surface modification method according to claim 2, wherein the organic compound contains at least one selected from the group consisting of an alcohol, a ketone, an aldehyde, and a phenol.

4. The fluorine resin surface modification method according to claim 3, wherein the organic compound contains at least one selected from the group consisting of an alcohol having 10 or less carbon atoms and a ketone having 10 or less carbon atoms.

5. The fluorine resin surface modification method according to claim 4, wherein the organic compound contains at least one selected from the group consisting of an alcohol having 2 or more and 4 or less carbon atoms and acetone.

6. The fluorine resin surface modification method according to claim 1, wherein the hydrophilized layer is a layer substantially composed of a carbon atom, a hydrogen atom, and an oxygen atom.

7. The fluorine resin surface modification method according to claim 6, wherein the organic compound brought into contact with the surface of the fluorine resin is irradiated with the ultraviolet light.

8. The fluorine resin surface modification method according to claim 6, wherein the generated radical is sprayed onto the surface of the fluorine resin.

9. The fluorine resin surface modification method according to claim 6, wherein the ultraviolet light is generated by a xenon excimer lamp.

10. A surface-modified fluorine resin production method comprising the steps of:
    preparing a material having a surface having a fluorine resin provided thereon; and
    modifying the surface of the fluorine resin by the fluorine resin surface modification method according to claim 6.

11. A joining method comprising the step of joining a material containing at least one selected from the group consisting of a metal, a resin, and a ceramic to the hydrophilized layer modified by the fluorine resin surface modification method according to claim 6.

12. A material having a surface-modified fluorine resin, the material comprising:
a fluorine resin provided on a surface of the material; and
a hydrophilized layer provided on at least a part of a surface of the fluorine resin, the hydrophilized layer composed of a functional group composed of a carbon atom, a hydrogen atom, and an oxygen atom,
wherein the hydrophilized layer is made by a method comprising:
irradiating an organic compound containing an oxygen atom with ultraviolet light having at least an intensity in a wavelength range of 205 nm or less, while the organic compound containing the oxygen atom is continuously supplied in gaseous form, to generate a radical, and
bringing the radical into contact with the surface of the fluorine resin to form the hydrophilized layer on the at least the part of the surface of the fluorine resin; and
wherein the at least the part of the surface of the fluorine resin including the hydrophilized layer provided thereon has a peak intensity of carbon atoms and a peak intensity of oxygen atoms that are higher than a peak intensity of fluorine atoms in a photoelectron spectrum by XPS survey analysis.

13. A joined body comprising:
the material having a surface-modified fluorine resin according to claim 12; and
a material containing at least one selected from the group consisting of a metal, a resin, and a ceramic, and joined to the hydrophilized layer directly or with an adhesive layer interposed therebetween.

14. The joined body according to claim 13, wherein the material to be joined to the hydrophilized layer is a metal, and the fluorine resin is a circuit board material.

* * * * *